US012620421B2

(12) United States Patent
Kim et al.

(10) Patent No.: US 12,620,421 B2
(45) Date of Patent: May 5, 2026

(54) MEMORY WITH REDUCED LEAKAGE THROUGH ANALOG HEAD SWITCH CONTROL

(71) Applicant: QUALCOMM Incorporated, San Diego, CA (US)

(72) Inventors: Seohee Kim, San Diego, CA (US); Chulmin Jung, San Diego, CA (US); Xiao Chen, San Diego, CA (US); Yi-Ju Chen, Toufen (TW); Hanil Lee, San Diego, CA (US); Subbarao Palacharla, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 18/653,472

(22) Filed: May 2, 2024

(65) Prior Publication Data

US 2025/0342866 A1 Nov. 6, 2025

(51) Int. Cl.
*G11C 5/14* (2006.01)
*G11C 11/413* (2006.01)

(52) U.S. Cl.
CPC ............ *G11C 5/147* (2013.01); *G11C 11/413* (2013.01)

(58) Field of Classification Search
CPC ............................... G11C 5/147; G11C 11/413
See application file for complete search history.

(56) References Cited

U.S. PATENT DOCUMENTS

| | | | |
|---|---|---|---|
| 9,019,751 B2 | 4/2015 | Jin et al. | |
| 9,647,551 B2 | 5/2017 | Price et al. | |
| 2003/0034829 A1* | 2/2003 | Wu ............................ | G05F 1/46 |
| | | | 327/540 |
| 2006/0190894 A1* | 8/2006 | Jwalant .................... | H05K 3/30 |
| | | | 716/122 |
| 2010/0254206 A1* | 10/2010 | Campbell ................ | G11C 7/12 |
| | | | 365/230.06 |
| 2011/0261629 A1 | 10/2011 | Seshadri et al. | |
| 2014/0177349 A1 | 6/2014 | Dreesen et al. | |
| 2015/0077076 A1 | 3/2015 | Bhattad | |
| 2022/0093204 A1 | 3/2022 | Chaudhry et al. | |

FOREIGN PATENT DOCUMENTS

| | | |
|---|---|---|
| EP | 3565120 B1 | 9/2022 |
| WO | 2017030683 A1 | 2/2017 |

OTHER PUBLICATIONS

International Search Report and Written Opinion—PCT/US2025/020461—ISA/EPO—Jun. 24, 2025.

* cited by examiner

*Primary Examiner* — Jay W. Radke
(74) *Attorney, Agent, or Firm* — Loza & Loza, LLP

(57) ABSTRACT

A memory is provided that includes an analog gate voltage driver that drives the gate of a head switch transistor for a bitcell array with an analog gate voltage while the bitcell array operates in a light-sleep mode. The analog gate voltage switches the head switch transistor partially on so that the head switch transistor passes a reduced power supply voltage despite being powered by a memory power supply voltage that is greater than the reduced power supply voltage. The reduced power supply voltage has a sufficient magnitude so that the bitcell array retains its stored binary contents during the light-sleep mode.

24 Claims, 5 Drawing Sheets

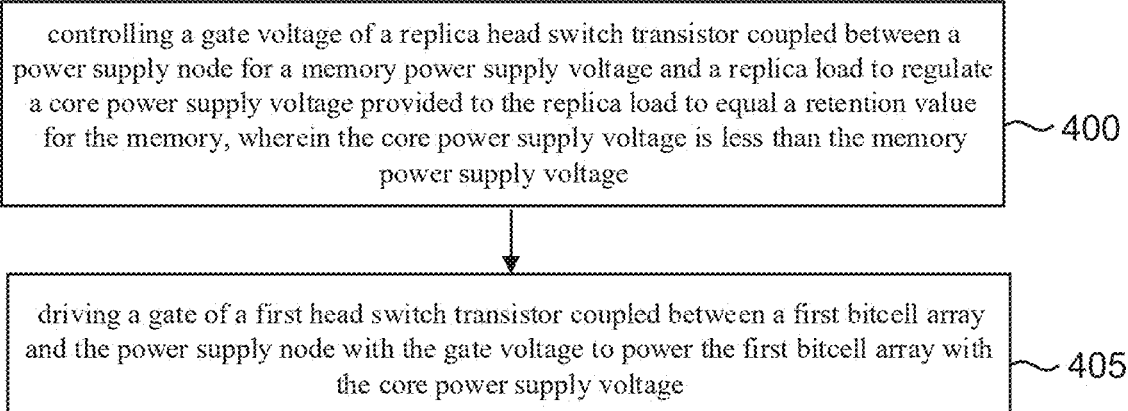

controlling a gate voltage of a replica head switch transistor coupled between a power supply node for a memory power supply voltage and a replica load to regulate a core power supply voltage provided to the replica load to equal a retention value for the memory, wherein the core power supply voltage is less than the memory power supply voltage

~400 driving a gate of a first head switch transistor coupled between a first bitcell array and the power supply node with the gate voltage to power the first bitcell array with the core power supply voltage

MEMORY WITH REDUCED LEAKAGE THROUGH ANALOG HEAD SWITCH CONTROL

TECHNICAL FIELD

The present application relates generally to memories and, more specifically, to memories having reduced leakage through analog head switch control.

BACKGROUND

An integrated circuit with an embedded memory such as a static random-access memory (SRAM) will typically have various operating modes in which a memory power supply voltage for the embedded memory is varied according to the operating mode. With respect to these modes, the integrated circuit may be divided into separate power domains. A core domain (CX) power supply voltage (VDDCX) powers a core domain including a processor whereas a memory domain (MX) power supply voltage (VDDMX) powers the bitcells of the SRAM. But an SRAM does not consist merely of the bitcells but also includes a memory periphery that includes components such as address decoders and other logic. A majority of the memory periphery is contained within the MX domain but there is a CX domain portion of the memory periphery for components such as level-shifters. A memory unit such as an SRAM may thus be divided into a periphery CX domain, a periphery MX domain, and a bitcell domain that is powered by the memory power supply voltage. In the present disclosure, the periphery CX domain and/or the periphery MX domain may be optional for some or all memory units whereas each memory unit comprises (at least) the bitcell domain (also referred to as bitcell array in the following To reduce power consumption and increase battery life, the memory may be placed into a deep-sleep mode in which the bitcell domain, the periphery CX domain, and the periphery MX domain are all powered down. This involves the switching off the head switch transistors that are configured to couple between the power rails for the VDDCX and VDDMX power supply voltages and the corresponding power domains. In a default mode (which may also be denoted as an active mode of operation), the head switch transistors are all on so that the corresponding power domains are all fully powered. In addition, the memory domain power supply voltage VDDMX is sufficiently elevated during the active mode for increased memory speed. During a retention mode, the head switch transistors for the periphery MX and CX domains are powered off. The head switch transistors for the bitcell MX domain remain on so that the bitcells may retain their stored binary content during the retention mode but the memory domain power supply voltage is lowered from its active value to a retention value so that the bitcells have reduced leakage during the retention mode.

SUMMARY

In accordance with an aspect of the disclosure, a memory is provided that includes: a power supply node for a memory power supply voltage; at least one head switch transistor coupled to the power supply node; a bitcell array coupled between the at least one head switch transistor and ground; and a voltage regulator configured to regulate a gate voltage of the at least one head switch transistor during a light-sleep mode for the bitcell array.

In accordance with another aspect of the disclosure, a memory is provided that includes: a power supply node for a memory power supply voltage; a first bitcell array; a first head switch transistor coupled between the first bitcell array and the power supply node; and a first multiplexer having an output terminal coupled to a gate of the first head switch transistor, wherein the first multiplexer is configured to select between a digital gate voltage to switch the first head switch transistor fully on during an active mode for the first bitcell array and an analog gate voltage to switch the first head switch transistor partially on during a light-sleep mode for the first bitcell array.

In accordance with yet another aspect of the disclosure, a method of powering a memory is provided that includes: controlling a gate voltage of a replica head switch transistor coupled between a power supply node for a memory power supply voltage and a replica load to regulate a core power supply voltage provided to the replica load to equal a retention value for the memory, wherein the core power supply voltage is less than the memory power supply voltage; and driving a gate of a first head switch transistor coupled between a first bitcell array and the power supply node with the gate voltage to power the first bitcell array with the core power supply voltage Finally, in accordance with another aspect of the disclosure, a memory is provided that includes: a power supply node for a memory power supply voltage; a plurality of head switch transistors coupled to the power supply node; a bitcell array coupled between the plurality of head switch transistors and ground; and means for generating an analog gate voltage of the plurality of head switch transistors to maintain the plurality of head switch transistors partially on during a light-sleep mode for the bitcell array.

These and other advantageous features may be better appreciated through the following detailed description.

BRIEF DESCRIPTION OF THE DRAWINGS

FIG. 4 is a flowchart for a method of operation of a memory including an analog gate voltage driver in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

In the following discussion, SRAM is used as an example to illustrate the concept. Nonetheless, one of skill in the art would ready recognize that the power management techniques discussed herein are generally applicable to other types of embedded memories in a chip such as dynamic random access memories (DRAMs). The bitcells for an SRAM are arranged into rows and columns to form a bitcell array. Each row is traversed by a corresponding word line whereas a pair of bit lines traverses each column. It may thus be appreciated that the word line length and the bit line length increases as the row and column size is increased. But this increased length comes at the cost of increased capacitance, which slows the memory operating speed. The bitcells are thus typically arranged into banks instead of into one large array. Each bank of bitcells has its own rows and columns. In this fashion, the capacitance for the word lines and the bit lines may be kept to a manageable level for increased memory speed.

Although the arrangement of the bitcells into banks is thus advantageous, it may be cumbersome for each bank to have an independently regulated memory domain (MX) power supply voltage. Instead, the banks typically share a memory power supply voltage. A power source such as a switching power supply regulates the memory power supply voltage that is supplied to a power supply rail or node. Each bank couples to the power supply node through corresponding head switch transistors. Depending upon the current operating requirements, some banks may be active whereas other banks may be idle. The active banks operate in the active mode and thus the memory power supply voltage is its elevated level. But with the memory power supply voltage at its elevated level, the idle banks powered by the memory power supply voltage cannot be transitioned to the retention mode. The idle banks then have elevated leakage due to their operation in the active mode rather than in the retention mode.

Figure 2:
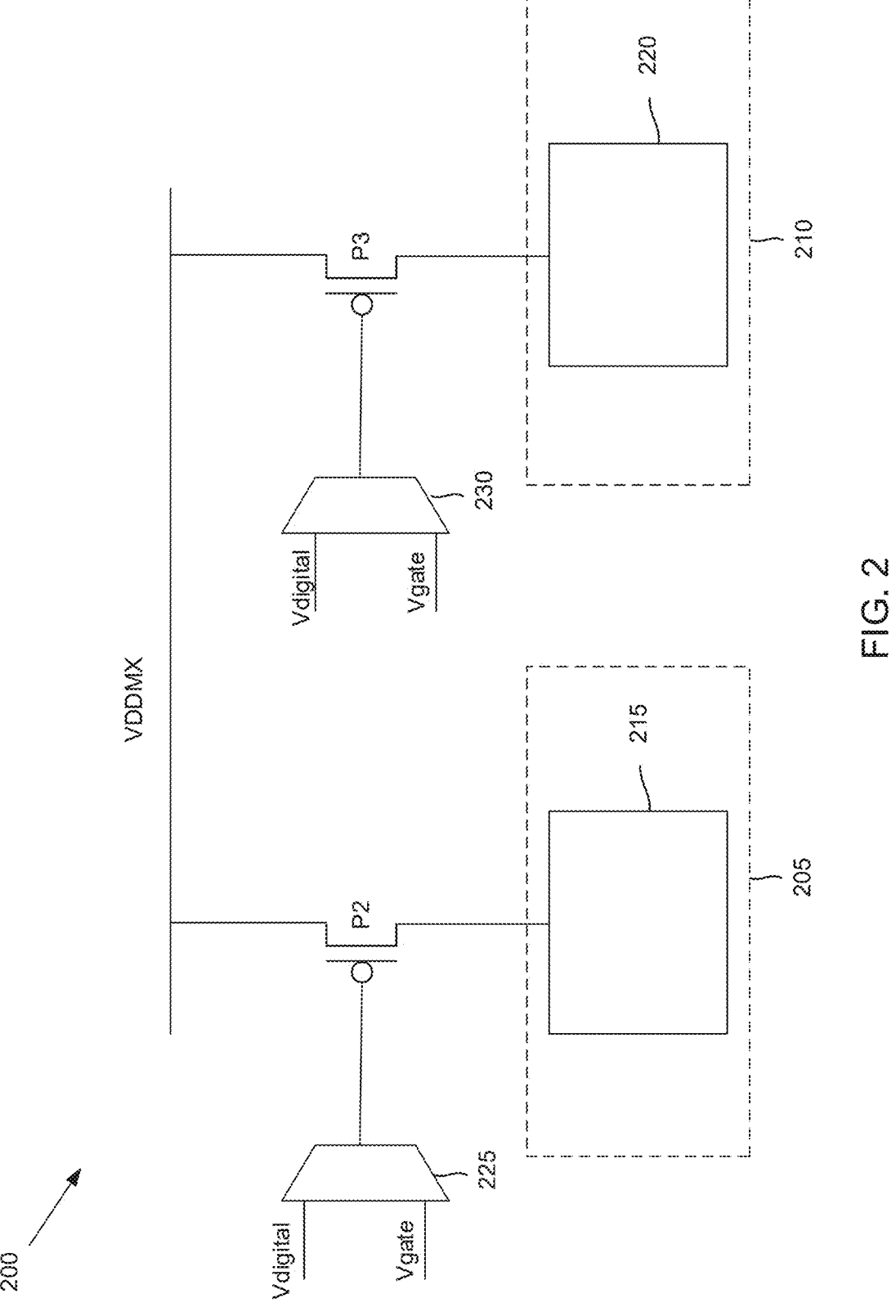
FIG. 2 illustrates a memory including a pair of banks powered by head switch transistors that are controlled by mode multiplexers that may select between analog gate voltage and a digital gate voltage in accordance with an aspect of the disclosure.

To avoid the leakage of traditional power modes, a memory according to aspects of the disclosure includes a plurality of banks in which at least one bank is provided with a "light-sleep" mode of operation in which an analog gate voltage driver controls an analog gate voltage of the head switch transistors for the bank in the light-sleep mode such that the head switch transistors are neither fully on nor off but instead are partially on. Due to this partially-on state, the head switch transistors pass a reduced power supply voltage despite being powered by the memory power supply voltage while the memory power supply voltage is at an elevated level for powering other banks in the active mode. To permit operating some or all of the plurality of banks in the light-sleep mode, the head switch transistors for the respective banks may be controlled by at least one analog gate voltage driver. In some aspects, each head switch transistor may be controlled independently, e.g., by using associated multiplexers (as shown in FIG. 2). In some aspects, groups of head switch transistors may be controlled independently with the head switch transistors of each group being controlled jointly. The banks (bitcell arrays) may be formed identical, i.e., with the same number and arrangement of bitcells.

This analog control of the head switch transistor gate voltage may be contrasted with the traditional digital control used for the active, retention, and deep-sleep modes. With respect to this digital control, the gate voltage of the head switch transistor is either a binary one (charged to the memory power supply voltage) or a binary zero (discharged to ground). Such a gate voltage is denoted herein as a digital gate voltage. Depending upon the polarity of the head switch transistor, the head switch transistor is then fully on or fully off in response to the digital control. For example, a p-type metal-oxide semiconductor (PMOS) head switch transistor is fully on in response to its gate being grounded. But in the analog control of the head switch transistors disclosed herein, the gate voltage is neither a binary zero nor a binary one but instead is some fraction of the memory power supply voltage such that the head switch transistor is neither fully on nor fully off but instead is partially on.

In the following discussion, it will be assumed that the head switch transistors are PMOS head switch transistors although n-type metal-oxide semiconductor (NMOS) head switch transistors may be used in alternative implementations. The reduced power supply voltage supplied by the partially-on head switch transistors in the light-sleep mode is at the retention level as compared to the memory power supply voltage, which may remain at the elevated level for the active mode. Thus, the reduced power supply voltage is lower than the memory power supply voltage but greater than ground. The result is quite advantageous in that the banks operating in the active mode do not force the banks operating in the light-sleep mode to be powered by the elevated memory power supply voltage. In this fashion, the light-sleep mode banks will conduct a reduced amount of leakage current despite the memory power supply voltage remaining at the elevated level for the banks operating in the active mode.

In the light-sleep mode, the periphery CX domain may be partially or completely collapsed such that some or all of the head switch transistors for the periphery CX domain are switched off. But the head switch transistors for the periphery MX domain and the bitcell domain are maintained partially on through the analog gate control from the analog gate voltage driver so that these domains remained powered by the reduced power supply voltage (which is also denoted as a core power supply voltage herein). Additionally, separate head switch transistors may be provided for the periphery MX domain which are configured to be maintained partially on through the analog gate control from the analog gate voltage driver. Alternatively, the above-described head switch transistors for the bitcell domain may be provided for both the bitcell domain and the periphery MX domain. The bitcells thus retain their stored binary content since the core power supply voltage is at the retention level. Although keeping the periphery MX domain powered during the light-sleep mode allows the periphery MX domain to conduct some amount of leakage current, the transition speed from the light-sleep mode to the active mode is increased as compared to collapsing the periphery MX domain. However, in alternative implementations, only the bitcell domain would remain powered in the light-sleep mode (e.g., by providing separate head switch transistors for the bitcell domain and the periphery MX domain) while the periphery MX domain is collapsed (i.e., powered down). This resulting shutdown of the periphery MX domain in the light-sleep mode reduces the power loss from leakage currents at the cost of an increased transition time from the light-sleep mode to the active mode. Thus, the following discussion will be directed to implementations in which the periphery MX domain remains powered during the light-sleep mode without loss of generality.

In some aspects, a bitcell array and an associated periphery MX domain may be provided for a bank. During the light-sleep mode, both the bitcell array and the associated periphery MX domain for the bank act as a load to their respective head switch transistors that conducts a certain amount of leakage current. The analog gate voltage driver may include a replica load circuit that models this load. In other aspects, the replica load circuit may model a load corresponding to the bitcell array only (e.g., when one or more separate head switch transistors are provided for the periphery MX domain). In one implementation, the replica load circuit may be formed by duplicating the bitcell array and the circuitry within the periphery MX domain. Alternatively, the replica load circuit may be formed so as to conduct a leakage current having a known proportionality to the leakage current conducted by the bitcell array and the periphery MX domain.

In addition to the replica load circuit, the analog gate voltage driver may include a replica head switch transistor. Analogously as discussed for the replica load circuit, the replica head switch transistor may be sized to be an exact replica of each head switch transistor for the bitcell domain and the periphery MX domain. Generally leakage current may increase with respect to a decrease in transistor size. The known relationship of transistor size and leakage current may be exploited when replicating a head switch transistor sized to have a known proportionality to the size of the head switch transistor(s) for the bitcell domain and/or the periphery MX domain. Alternatively, the replica head switch transistor may be sized to have a known proportionality to the head switch transistor size. The replica head switch transistor has a source terminal coupled to the power supply rail for the memory power supply voltage and a remaining drain terminal coupled to the replica load circuit. The analog gate voltage driver may be configured to generate an analog gate voltage for the replica head switch transistor so that the drain voltage of the replica head switch transistor is maintained at the retention level. During the light-sleep mode for a given bank, the same analog gate voltage may be coupled to the gates of the head switch transistors for the bitcell array and the associated periphery MX domain. The bitcell array and the associated periphery MX domain is thus powered at the retention level. In this fashion, an array of banks may share a memory power supply voltage such that some of the banks may be powered by the elevated voltage level of the memory power supply voltage in the active mode while other ones of the banks may be powered by the retention voltage level in the light-sleep mode.

Figure 1:
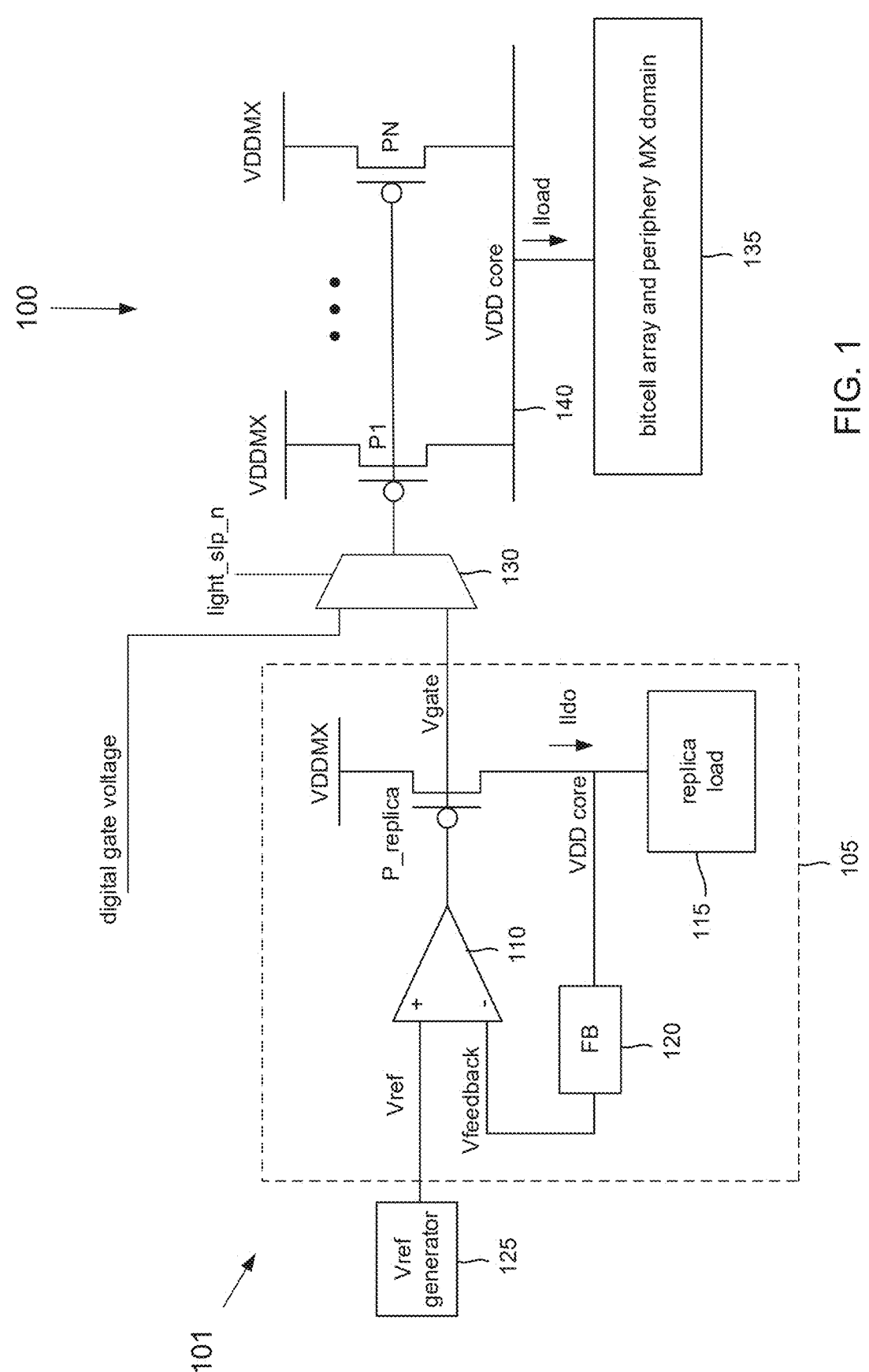
FIG. 1 illustrates a memory including an analog gate voltage driver in accordance with an aspect of the disclosure.

An example analog gate voltage driver 101 for a memory 100 is shown in FIG. 1. The present disclosure is, however, not limited thereto and other analog gate voltage drivers, e.g., without the replica load and/or the replica head switch transistor (as described above), may be used. In the illustrated aspect, a voltage regulator regulates a gate voltage of a plurality of N head switch transistors ranging from a first head switch transistor P1 to an Nth head switch transistor PN, wherein N is a plural positive integer. In one example implementation, the voltage regulator may be a low-dropout regulator (LDO) 105 but it will be appreciated that other types of voltage regulators may be used in alternative implementations. For illustration clarity, only the first head switch transistor P1 and the Nth head switch transistor PN from the plurality of N head switch transistors are shown in FIG. 1. The LDO 105 includes a differential amplifier 110 configured to develop the analog gate voltage Vgate for a replica head switch transistor (P_replica) having a source coupled to a power supply node for the memory power supply voltage VDDMX and a drain coupled to a replica load 115. The replica load 115 couples between the drain of the replica head switch transistor and ground and draws an LDO current (Ildo). Through Ohm's law, the conducting of the LDO current through the replica load 115 to ground develops a core power supply voltage (VDD core) at the drain of the replica head switch transistor. To regulate the core power supply voltage to equal the retention level for the bitcell domain (of the bitcell array and the periphery MX domain 135), the core power supply voltage couples through a feedback network 120 to the differential amplifier 110.

The feedback network 120 may comprise a voltage divider such that it couples a divided version of the core power supply voltage as a feedback voltage (Vfeedback) to a first input terminal (for example, an inverting input terminal) of the differential amplifier 110. Alternatively, the feedback network 120 may simply be a lead or connector such that the feedback voltage equals the core power supply voltage. To regulate the core power supply voltage to the retention level, the differential amplifier 110 may be configured to control a gate voltage (Vgate) of the replica head switch transistor so that the feedback voltage equals a reference voltage (Vref) received at a second input terminal (e.g., a non-inverting input terminal) of the differential amplifier 110. A suitable reference voltage generator 125 such as a bandgap reference generator may generate the reference voltage. Other reference voltage generators are possible. Since the gate voltage Vgate is controlled to lie between the memory domain power supply voltage and ground, the gate voltage driver 101 provides an analog gate voltage.

The active level of the memory power supply voltage VDDMX and the retention level of the core power supply voltage will vary depending upon the process node used to construct the memory 100. In one implementation, the active level may be 0.8V whereas the retention level may be 0.5V but it will be appreciated that these voltages may be higher or lower in alternative implementations in which the retention level is lower than the active level. Regardless of the exact values, the retention value will typically be significantly lower than the active value (e.g., less than 90% or less than 80% of the active level) to reduce the leakage current during the light-sleep mode.

The plurality of N head switch transistors powers a bitcell array and an associated periphery MX domain 135, where N is a plural positive integer. More generally, the plurality of N head switch transistors comprises at least one head switch transistor. In some aspects, a single head switch transistor may power the bitcell array and the associated periphery MX domain 135 (also referred to as a memory unit in this disclosure). The periphery MX domain may include a plurality of write drivers, sense amplifiers, and/or associated circuits for reading and writing to the bitcell array. Each head switch transistor has a source coupled to the power supply node for the memory power supply voltage VDDMX and has a drain coupled to an internal power supply rail 140 for the core power supply voltage. The bitcell array and periphery MX domain 135 may couple between the internal power supply rail 140 and ground. Should the analog gate voltage from the analog gate voltage driver 101 pass through a mode multiplexer 130, the head switch transistors will have the same analog gate voltage as applied to the replica head switch transistor. For example, the mode multiplexer 130 may respond to an assertion of an active-low light-sleep mode control signal (light_slp_n) to select for the analog gate voltage as generated by the voltage regulator 105. As used herein, a binary signal is deemed to be asserted when the binary signal has a logical true value, regardless of whether the logical true value is expressed using an active-low or active-high convention. In an active-low convention, a binary signal is asserted by being grounded and de-asserted by being asserted to the memory power supply voltage. In an active-high convention, a binary signal is asserted by being charged to the memory power supply voltage and de-asserted by being grounded.

Regardless of whether an active-high or active-low convention is used, the mode multiplexer 130 may be configured to respond to an assertion of the light-sleep mode control signal by selecting for the analog gate voltage from the analog gate voltage driver 101. Since the replica head switch transistor is sized identically to each head switch transistor (or has a size having known proportionality to the head switch transistor size) and since the replica load 115 is constructed to draw the LDO current that is either identical to or has a known proportionality to a load current (Iload) drawn by the bitcell array and periphery MX domain 135, the regulation of the analog gate voltage by the LDO 105 controls the core power supply voltage at the internal power supply rail 140 to be maintained at the retention level. Conversely, should the light-sleep mode control signal not be asserted, the mode multiplexer 130 selects for a digital gate voltage. The digital gate voltage is charged to the memory power supply voltage during a deep-sleep mode in which the head switch transistors are fully off to power down the bitcell array and periphery MX domain 135. During an active mode in which the head switch transistors are fully on to pass the memory power supply voltage to the bitcell array and periphery MX domain 135, the digital gate voltage is grounded. In contrast to the digital gate voltage, the analog gate voltage from the analog gate voltage driver 101 only partially switches on the head switch transistors—the head switch transistors are neither fully on nor fully off during the light-sleep mode. In one implementation, the analog gate voltage driver 101 may be deemed to form a means for generating an analog gate voltage for a plurality of head switch transistors to maintain the plurality of head switch transistors partially on during a light-sleep mode for a bitcell array.

The resulting multiplexing of the digital and analog gate voltages for the head switch transistors is quite advantageous as the power supply node for the memory power supply voltage may then be shared by multiple banks with some of the banks being in the active mode whereas idle ones of the banks may be in the light-sleep mode despite the memory power supply voltage being maintained at the active level. This may be achieved by providing multiple instances of mode multiplexer 130 which are configured to be independently controlled via respective light-sleep mode control signals (light_slp_n). Each mode multiplexer 130 of the plurality of mode multiplexers may be configured to select between the analog gate voltage and the digital gate voltage as described above according to the respective light-sleep mode control signal. The mode multiplexers 130 may each be coupled to respective gates of one or more head switch transistors wherein, in some aspects, all of the head switch transistors with gates coupled to a particular mode multiplexer may be associated with a particular bitcell array and periphery MX domain as described above with respect to FIG. 1.

For example, a memory 200 with a plurality of banks (or memory units) including a first bank 205 and a second bank 210 is shown in FIG. 2. For illustration clarity, the first bank 205 is shown as including a bitcell array and periphery MX domain 215 that is powered by a single head switch transistor P2. Similarly, the second bank 210 is shown including a bitcell array and periphery MX domain 220 that is powered by a single head switch transistor P3. However, it will be appreciated that each bitcell array and periphery MX domain may be powered by more than one head switch transistor such that a single head switch transistor for each bank is shown merely for illustration clarity. A mode multiplexer 225 selects between the analog gate voltage Vgate and a digital gate voltage Vdigital to drive the gate of the head switch transistor P2. Similarly, a mode multiplexer 230 selects between the analog gate voltage Vgate and the digital gate voltage Vdigital to drive the gate of the head switch transistor P3. The memory power supply voltage (VDDMX) at the sources of the head switch transistors P2 and P3 is charged to the active level.

Suppose that the first bank 205 is in the active mode whereas the second bank 210 is idle and is thus transitioned to the light-sleep mode. The mode multiplexer 225 would then select for the digital gate voltage, which would be grounded to fully switch on the head switch transistor P2. The fully-on head switch transistor P2 would then pass the memory power supply voltage with virtually no voltage drop so that the bitcell array and periphery MX domain 215 in the first bank 205 may be powered at the active level. But the mode multiplexer 230 for the second bank 210 would select for the analog gate voltage to drive the gate of the head switch transistor P3. The head switch transistor P3 is thus only partially on such that the core power supply voltage that it passes to the bitcell array and periphery MX domain 220 in the second bank 210 is at the retention level despite the memory power supply voltage remaining at the active level. In this fashion, a plurality of banks may share a common power supply node without forcing each bank to remain in the active mode should one (or more) of the banks operate in the active mode. Should none of the banks be in the active mode, the memory power supply voltage may be dropped to the retention level. Dropping the memory domain power supply voltage to the retention level may be done by changing the voltage at the common power supply node. The head switch transistors for just the bitcell domains would then be switched fully on so that the bitcell domains may be in the retention mode while the periphery domains (both CX and MX) are collapsed (i.e., powered down). Alternatively, the digital gate voltage may be charged to the memory power supply voltage such that each bank is collapsed (powered down) in the deep-sleep mode.

Figure 3:
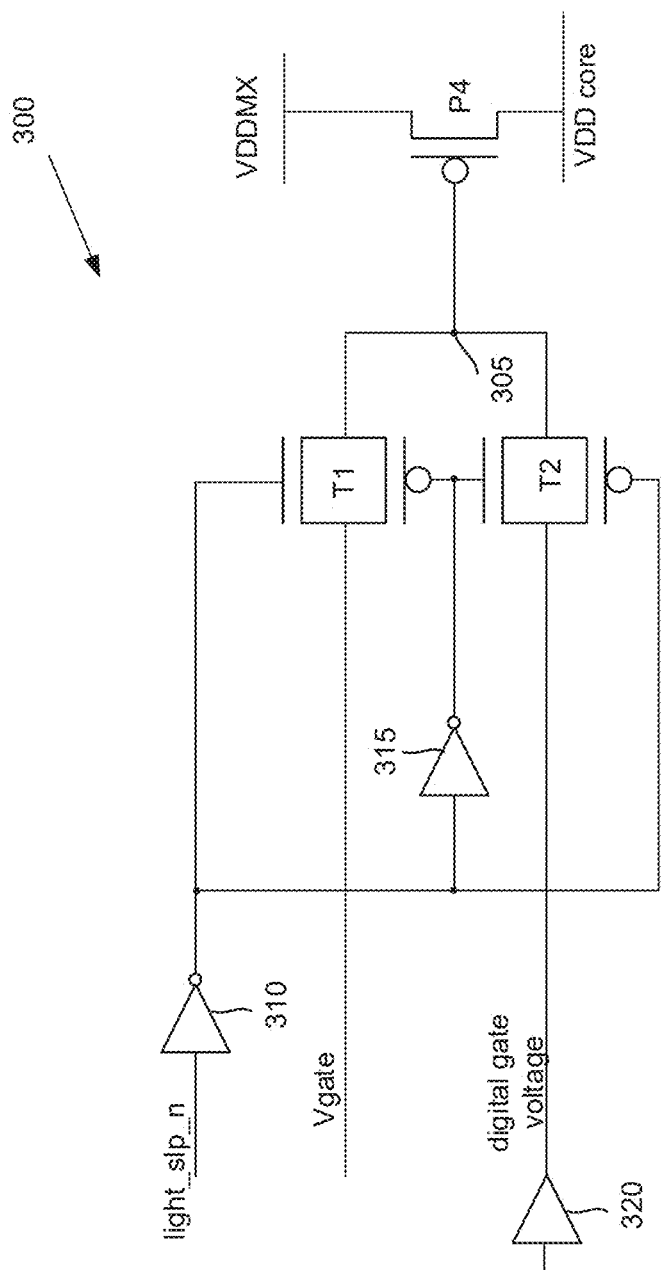
FIG. 3 is a circuit diagram of an example mode multiplexer for controlling a head switch transistor in accordance with an aspect of the disclosure.

An example mode multiplexer 300 is shown in more detail in FIG. 3. A first transmission gate T1 passes the analog gate voltage to an output terminal 305 of the mode multiplexer 300 when the transmission gate T1 is open. The output terminal 305 couples to the gates of the head switch transistors (for example, a head switch transistor P4) for a bitcell array and associated periphery MX domain. Should the transmission gate T1 be closed, the analog gate voltage is blocked from passing though the output terminal 305 to the gates of the head switch transistors. A light-sleep mode control signal is provided to the gates of the transistors in the transmission gate T1 to control whether the transmission gate T1 is open or closed. In the illustrated exemplary implementation, an active-low light-sleep mode control signal (light_slp_n) controls whether the transmission gate T1 is open or closed. An inverter 310 inverts the light-sleep mode control signal to control the NMOS transistor side of the transmission gate T1. The inverter 315 inverts the inverted light-sleep mode control signal from the inverter 310 to recover the light-sleep control signal to control the PMOS transistor side of the transmission gate T1. The transmission gate T1 will thus be open in response to an assertion of the light-sleep mode control signal and will be closed in response to a de-assertion of the light-sleep mode control signal. Alternatively, an active-high light-sleep mode control signal may be used in implementations in which the inverter 310 is omitted.

A second transmission gate T2 passes the digital gate voltage to the output terminal 305 when the transmission gate T2 is open to drive the gate of the head switch transistors such as the head switch transistor P4. The recovered light-sleep mode control signal from the inverter 315 controls the NMOS transistor side of the transmission gate T2. Similarly, the inverted light-sleep mode control signal from the inverter 310 controls the PMOS transistor side of the transmission gate T2. The transmission gate T2 will thus be closed in response to an assertion of the light-sleep mode control signal and will be open to pass the digital gate voltage to the output terminal 305 in response to a de-assertion of the light-sleep mode control signal. A buffer 320 may be used to buffer the digital gate voltage. Alternatively, an active-high light-sleep mode control signal may be used in implementations in implementations in which the inverter 315 is omitted.

An example method of operation for a memory will now be discussed with respect to the flowchart of FIG. 4. The method includes an act 400 controlling a gate voltage of a replica head switch transistor coupled between a power supply node for a memory power supply voltage and a replica load to regulate a core power supply voltage provided to the replica load to equal a retention value for the memory, wherein the core power supply voltage (and the retention value) is less than the memory power supply voltage. The control of the analog gate voltage by the analog gate voltage driver 101 is an example of act 400. The method also includes an act 405 of driving a gate of a first head switch transistor coupled between a first bitcell array and the power supply node with the gate voltage to power the first bitcell array with the core power supply voltage. The driving of either transistor P2 or transistor P3 of FIG. 2 with the analog gate voltage is an example of act 405.

Figure 5:
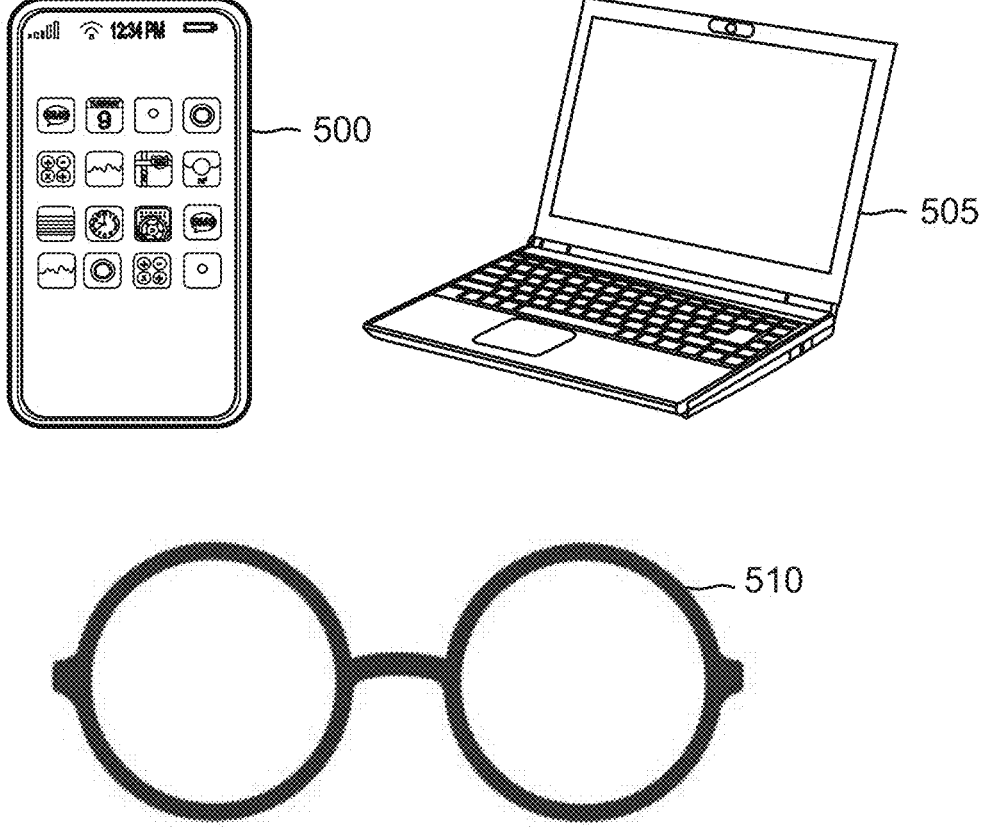
FIG. 5 illustrates some example electronic systems including a memory having an analog gate voltage driver in accordance with an aspect of the disclosure.

A memory as disclosed herein may be incorporated in a wide variety of electronic systems. For example, as shown in FIG. 5, a cellular telephone 500, a laptop computer 505, and an augmented reality device such as augmented reality glasses 510 may all include a memory in accordance with the disclosure. Other exemplary electronic systems such as a video player, a communication device, and a personal computer may also be configured with a memory constructed in accordance with the disclosure.

Some example implementations are described by the following numbered clauses:

Clause 1. A memory, comprising:

a power supply node for a memory power supply voltage;

at least one head switch transistor coupled to the power supply node;

a bitcell array coupled between the at least one head switch transistor and ground; and a voltage regulator configured to regulate a gate voltage of the at least one head switch transistor during a light-sleep mode for the bitcell array.

Clause 2. The memory of clause 1, wherein the voltage regulator comprises a low dropout regulator.

Clause 3. The memory of any of clauses 1-2, wherein the voltage regulator includes a replica load circuit configured to replicate a leakage current of the bitcell array during the light-sleep mode.

Clause 4. The memory of clause 3, wherein the voltage regulator further includes a replica head switch transistor having a size that is proportional to a size of the at least one head switch transistor.

Clause 5. The memory of clause 4, wherein the size of the replica head switch transistor equals the size of the at least one head switch transistor.

Clause 6. The memory of any of clauses 4-5, wherein a gate of the replica head switch transistor is coupled to a gate of the at least one head switch transistor, and wherein the voltage regulator further includes a differential amplifier configured to compare a feedback voltage from the replica head switch transistor to a reference voltage to regulate the gate voltage of the replica head switch transistor.

Clause 7. The memory of clause 6, wherein the voltage regulator further includes a feedback network to couple the feedback voltage from the replica head switch transistor to the differential amplifier.

Clause 8. The memory of clause 7, wherein the feedback network comprises a voltage divider.

Clause 9. The memory of any of clauses 6-8, further comprising:

a voltage reference generator configured to generate the reference voltage.

Clause 10. The memory of clause 9, wherein the voltage reference generator comprises a bandgap reference generator.

Clause 11. The memory of any of clauses 6-10, further comprising:

an internal power rail; and a memory periphery, wherein the memory periphery and the bitcell array are coupled between the internal power rail and ground, and wherein the least one head switch transistor comprises a plurality of head switch transistors coupled between the power supply node and the internal power rail.

Clause 12. The memory of clause 11, wherein the memory periphery includes a plurality of write drivers.

Clause 13. The memory of any of clauses 6-12, further comprising:

a multiplexer coupled between an output terminal of the differential amplifier and a gate of the at least one head switch transistor.

Clause 14. The memory of clause 13, wherein the multiplexer includes a first transmission gate coupled between the output terminal of the differential amplifier and the gate of the at least one head switch transistor, wherein the first transmission gate is configured to open and close responsive to a light-sleep mode control signal.

Clause 15. The memory of clause 14, wherein the multiplexer further includes a second transmission gate coupled between a buffer for a digital gate voltage and the gate of the least one head switch transistor, wherein the second transmission gate is configured to open and close responsive to a light-sleep mode control signal in a complementary fashion to the first transmission gate.

Clause 16. The memory of clause 15, wherein the at least one head switch transistor comprises a p-type metal-oxide semiconductor (PMOS) transistor, and wherein the digital gate voltage equals the memory power supply voltage during a deep-sleep mode for the bitcell array and equals ground during an active mode for the bitcell array.

Clause 17. A memory, comprising:

a power supply node for a memory power supply voltage;

a first bitcell array;

a first head switch transistor coupled between the first bitcell array and the power supply node; and a first multiplexer having an output terminal coupled to a gate of the first head switch transistor, wherein the first multiplexer is configured to select between a digital gate voltage to switch the first head switch transistor fully on during an active mode for the first bitcell array and an analog gate voltage to switch the first head switch transistor partially on during a light-sleep mode for the first bitcell array.

Clause 18. The memory of clause 17, further comprising:
a second bitcell array;
a second head switch transistor coupled between the second bitcell array and the power supply node; and
a second multiplexer having an output terminal coupled to a gate of the second head switch transistor, wherein the second multiplexer is configured to select between the digital gate voltage to switch the second head switch transistor fully on during an active mode for the second bitcell array and the analog gate voltage to switch the second head switch transistor partially on during a light-sleep mode for the second bitcell array.

Clause 19. The memory of any of clauses 17-18, further comprising:
a voltage regulator configured to generate the analog gate voltage.

Clause 20. The memory of clause 19, wherein the voltage regulator comprises a low dropout regulator.

Clause 21. A method of powering a memory, comprising:
controlling a gate voltage of a replica head switch transistor coupled between a power supply node for a memory power supply voltage and a replica load to regulate a core power supply voltage provided to the replica load to equal a retention value for the memory, wherein the core power supply voltage is less than the memory power supply voltage; and
driving a gate of a first head switch transistor coupled between a first bitcell array and the power supply node with the gate voltage to power the first bitcell array with the core power supply voltage.

Clause 22. The method of clause 21, wherein the driving the gate of the first head switch transistor switches the first head switch transistor partially on, the method further comprising:
fully switching on a second head switch transistor coupled between a second bitcell array and the power supply node to power the second bitcell array with the memory power supply voltage.

Clause 23. The method of any of clauses 21-22, wherein controlling the gate voltage of the replica head switch transistor includes comparing a feedback voltage from the replica load to a reference voltage.

Clause 24. The method of any of clauses 21-23, further comprising:
powering a periphery of the first bitcell array with the core power supply voltage.

Clause 25. A memory, comprising:
a power supply node for a memory power supply voltage;
a plurality of head switch transistors coupled to the power supply node;
a bitcell array coupled between the plurality of head switch transistors and ground; and
means for generating an analog gate voltage of the plurality of head switch transistors to maintain the plurality of head switch transistors partially on during a light-sleep mode for the bitcell array.

Clause 26. The memory of clause 25, further comprising:
a multiplexer coupled between the means for generating the analog gate voltage and a gate for each head switch transistor in the plurality of head switch transistors, wherein the multiplexer is configured to select for the analog gate voltage during the light-sleep mode for the bitcell array.

Clause 27. The memory of clause 26, wherein the multiplexer is further configured to select for a digital gate voltage during an active mode for the bitcell array.

Clause 28. The memory of clause 27, wherein the plurality of head switch transistors comprises a plurality of PMOS transistors, and wherein the digital gate voltage is ground during the active mode for the bitcell array.

Clause 29. The memory of any of clauses 25-28, wherein the memory is included within an augmented reality device.

Clause 30. An electronic device comprising the memory of any of clauses 1-20 and 25-29.

Clause 31. A memory device, comprising:
a memory unit with a bitcell array;
a power supply node for a memory domain power supply voltage;
at least one head switch transistor coupled between the power supply node and the memory unit; and
a voltage regulator configured to regulate a gate voltage of the at least one head switch transistor during a light-sleep mode for the bitcell array such that the at least one head switch transistor is partially on.

Clause 32. The memory device of clause 31, wherein the voltage regulator is configured to regulate the gate voltage of the at least one head switch transistor during the light-sleep mode for the bitcell array to be lower than the memory domain power supply voltage and to be larger than a ground level.

Clause 33. The memory device of any of clauses 31-32, wherein the voltage regulator comprises a low-dropout regulator.

Clause 34. The memory device of any of clauses 31-33, wherein the voltage regulator includes a replica load circuit configured to replicate a leakage current of the bitcell array during the light-sleep mode.

Clause 35. The memory device of clause 34, wherein the voltage regulator further includes a replica head switch transistor coupled between the power supply node for the memory domain power supply voltage and the replica load circuit and having a size that is proportional to a size of the at least one head switch transistor.

Clause 36. The memory device of clause 35, wherein the size of the replica head switch transistor equals the size of the at least one head switch transistor.

Clause 37. The memory device of clause 35, wherein a gate of the replica head switch transistor is coupled to a gate of the at least one head switch transistor, and wherein the voltage regulator further includes a differential amplifier configured to compare a feedback voltage from the replica head switch transistor to a reference voltage to regulate the gate voltage of the replica head switch transistor.

Clause 38. The memory device of clause 37, wherein the voltage regulator further includes a feedback network to couple the feedback voltage from the replica head switch transistor to the differential amplifier.

Clause 39. The memory device of clause 38, wherein the feedback network comprises a voltage divider.

Clause 40. The memory device of clause 37, further comprising:
a reference voltage generator configured to generate the reference voltage.

Clause 41. The memory device of clause 40, wherein the reference voltage generator comprises a bandgap reference generator.

Clause 42. The memory device of clause 31, wherein the memory unit further comprises:

an internal power rail; and a memory periphery domain, wherein the memory periphery domain and the bitcell array are coupled between the internal power rail and ground, and wherein the least one head switch transistor comprises a plurality of head switch transistors coupled between the power supply node and the internal power rail.

Clause 43. The memory device of clause 42, wherein the memory periphery domain includes a plurality of write drivers.

Clause 44. The memory device of clause 31, further comprising:

a multiplexer coupled between an output terminal of the voltage regulator, a digital gate voltage supply, and a gate of the at least one head switch transistor and configured to select between an output voltage of the output terminal of the voltage regulator and a digital gate voltage of the digital gate voltage supply responsive to a light-sleep mode control signal.

Clause 45. The memory device of clause 44, wherein the multiplexer includes a first transmission gate coupled between the output terminal of the voltage regulator and the gate of the at least one head switch transistor, wherein the first transmission gate is configured to open and close responsive to the light-sleep mode control signal.

Clause 46. The memory device of clause 45, wherein the multiplexer further includes a second transmission gate coupled between the digital gate voltage supply and the gate of the least one head switch transistor, wherein the second transmission gate is configured to open and close responsive to the light-sleep mode control signal in a complementary fashion to the first transmission gate.

Clause 47. The memory device of clause 44, wherein the at least one head switch transistor comprises a p-type metal-oxide semiconductor (PMOS) transistor, and wherein the digital gate voltage equals the memory domain power supply voltage during a deep-sleep mode for the bitcell array and equals ground during an active mode for the bitcell array.

Clause 48. The memory device of clause 31, comprising:

a plurality of memory units, each memory unit having a bitcell array, wherein the at least one head switch transistor comprises a plurality of head switch transistors such that, for each memory unit of the plurality of memory units, at least one of the plurality of head switch transistors is coupled between the power supply node and the associated memory unit; and wherein the voltage regulator is configured to independently regulate gate voltages of at least two head switch transistors of the plurality of head switch transistors.

Clause 49. The memory device of clause 48, further comprising:

a first multiplexer having an output terminal coupled to a gate of a first head switch transistor of the at least two transistors, wherein the first multiplexer is configured to select between a digital gate voltage to switch the first head switch transistor fully on during an active mode for a first bitcell array of an associated first memory unit and an output voltage of the voltage regulator to switch the first head switch transistor partially on during a light-sleep mode for the first bitcell array; and a second multiplexer having an output terminal coupled to a gate of a second head switch transistor of the at least two transistors, wherein the second multiplexer is configured to select between the digital gate voltage to switch the second head switch transistor fully on during an active mode for a second bitcell array of an associated second memory unit and the output voltage of the voltage regulator to switch the second head switch transistor partially on during a light-sleep mode for the second bitcell array.

Clause 50. The memory device of clause 31, wherein the bitcell array comprises static random access memory (SRAM).

Clause 51. An augmented reality device comprising the memory device of clause 31.

Clause 52. A method of powering a memory device, comprising:

controlling a gate voltage of a replica head switch transistor coupled between a power supply node for a memory domain power supply voltage and a replica load to regulate a core power supply voltage provided to the replica load to equal a retention value for the memory device, wherein the core power supply voltage is less than the memory domain power supply voltage; and driving a gate of a first head switch transistor coupled between a first bitcell array of the memory device and the power supply node with the gate voltage to power the first bitcell array with the core power supply voltage.

Clause 53. The method of clause 52, wherein the driving the gate of the first head switch transistor switches the first head switch transistor partially on, the method further comprising:

fully switching on a second head switch transistor coupled between a second bitcell array of the memory device and the power supply node to power the second bitcell array with the memory domain power supply voltage.

Clause 54. The method of clause 52, wherein controlling the gate voltage of the replica head switch transistor includes comparing a feedback voltage from the replica load to a reference voltage.

Clause 55. The method of clause 54, further comprising:

powering a periphery of the first bitcell array with the core power supply voltage.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory, comprising:

a power supply node for a memory power supply voltage;

15 at least one head switch transistor coupled to the power supply node;

a bitcell array coupled between the at least one head switch transistor and ground;

a voltage regulator configured to regulate a gate voltage of the at least one head switch transistor during a light-sleep mode for the bitcell array, wherein the voltage regulator includes a replica load circuit configured to replicate a leakage current of the bitcell array during the light-sleep mode, and a replica head switch transistor having a size that is proportional to a size of the at least one head switch transistor, wherein a gate of the replica head switch transistor is coupled to a gate of the at least one head switch transistor, and wherein the voltage regulator further includes a differential amplifier configured to compare a feedback voltage from the replica head switch transistor to a reference voltage to regulate the gate voltage of the replica head switch transistor; and a multiplexer coupled between an output terminal of the differential amplifier and a gate of the at least one head switch transistor.

2. The memory of claim 1, wherein the voltage regulator comprises a low dropout regulator.

3. The memory of claim 1, wherein the size of the replica head switch transistor equals the size of the at least one head switch transistor.

4. The memory of claim 1, wherein the voltage regulator further includes a feedback network to couple the feedback voltage from the replica head switch transistor to the differential amplifier.

5. The memory of claim 4, wherein the feedback network comprises a voltage divider.

6. The memory of claim 1, further comprising:

a voltage reference generator configured to generate the reference voltage.

7. The memory of claim 6, wherein the voltage reference generator comprises a bandgap reference generator.

8. The memory of claim 1, further comprising:

an internal power rail; and a memory periphery, wherein the memory periphery and the bitcell array are coupled between the internal power rail and ground, and wherein the least one head switch transistor comprises a plurality of head switch transistors coupled between the power supply node and the internal power rail.

9. The memory of claim 8, wherein the memory periphery includes a plurality of write drivers.

10. The memory of claim 1, wherein the multiplexer includes a first transmission gate coupled between the output terminal of the differential amplifier and the gate of the at least one head switch transistor, wherein the first transmission gate is configured to open and close responsive to a light-sleep mode control signal.

11. The memory of claim 10, wherein the multiplexer further includes a second transmission gate coupled between a buffer for a digital gate voltage and the gate of the least one head switch transistor, wherein the second transmission gate is configured to open and close responsive to a light-sleep mode control signal in a complementary fashion to the first transmission gate.

12. The memory of claim 11, wherein the at least one head switch transistor comprises a p-type metal-oxide semiconductor (PMOS) transistor, and wherein the digital gate voltage equals the memory power supply voltage during a deep-sleep mode for the bitcell array and equals ground during an active mode for the bitcell array.

13. A memory, comprising:

a power supply node for a memory power supply voltage;

a first bitcell array;

a first head switch transistor coupled between the first bitcell array and the power supply node; and a first multiplexer having an output terminal coupled to a gate of the first head switch transistor, wherein the first multiplexer is configured to select between a digital gate voltage to switch the first head switch transistor fully on during an active mode for the first bitcell array and an analog gate voltage to switch the first head switch transistor partially on during a light-sleep mode for the first bitcell array.

14. The memory of claim 13, further comprising:

a second bitcell array;

a second head switch transistor coupled between the second bitcell array and the power supply node; and a second multiplexer having an output terminal coupled to a gate of the second head switch transistor, wherein the second multiplexer is configured to select between the digital gate voltage to switch the second head switch transistor fully on during an active mode for the second bitcell array and the analog gate voltage to switch the second head switch transistor partially on during a light-sleep mode for the second bitcell array.

15. The memory of claim 13, further comprising:

a voltage regulator configured to generate the analog gate voltage.

16. The memory of claim 15, wherein the voltage regulator comprises a low dropout regulator.

17. A method of powering a memory, comprising:

controlling a gate voltage of a replica head switch transistor coupled between a power supply node for a memory power supply voltage and a replica load to regulate a core power supply voltage provided to the replica load to equal a retention value for the memory, wherein the core power supply voltage is less than the memory power supply voltage;

driving a gate of a first head switch transistor coupled between a first bitcell array and the power supply node with the gate voltage to power the first bitcell array with the core power supply voltage, wherein the driving the gate of the first head switch transistor switches the first head switch transistor partially on; and fully switching on a second head switch transistor coupled between a second bitcell array and the power supply node to power the second bitcell array with the memory power supply voltage.

18. The method of claim 17, wherein controlling the gate voltage of the replica head switch transistor includes comparing a feedback voltage from the replica load to a reference voltage.

19. The method of claim 18, further comprising:

powering a periphery of the first bitcell array with the core power supply voltage.

20. A memory, comprising:

a power supply node for a memory power supply voltage;

a plurality of head switch transistors coupled to the power supply node;

a bitcell array coupled between the plurality of head switch transistors and ground; and means for generating an analog gate voltage of the plurality of head switch transistors to maintain the plurality of head switch transistors partially on during a light-sleep mode for the bitcell array.

21. The memory of claim 20, further comprising:
a multiplexer coupled between the means for generating the analog gate voltage and a gate for each head switch transistor in the plurality of head switch transistors, wherein the multiplexer is configured to select for the analog gate voltage during the light-sleep mode for the bitcell array.

22. The memory of claim 21, wherein the multiplexer is further configured to select for a digital gate voltage during an active mode for the bitcell array.

23. The memory of claim 22, wherein the plurality of head switch transistors comprises a plurality of PMOS transistors, and wherein the digital gate voltage is ground during the active mode for the bitcell array.

24. The memory of claim 20, wherein the memory is included within an augmented reality device.

\* \* \* \* \*